(12) United States Patent
Shiobara et al.

(10) Patent No.: US 6,376,100 B1
(45) Date of Patent: Apr. 23, 2002

(54) FLIP-CHIP TYPE SEMICONDUCTOR DEVICE UNDERFILL MATERIAL AND FLIP-CHIP TYPE SEMICONDUCTOR DEVICE

(75) Inventors: Toshio Shiobara; Kazuaki Sumita, both of Gunma-ken (JP)

(73) Assignee: Shin Etsu-Chemical Co., Ltd., Tokyo (JP)

( * ) Notice: Subject to any disclaimer, the term of this patent is extended or adjusted under 35 U.S.C. 154(b) by 0 days.

(21) Appl. No.: 09/590,303

(22) Filed: Jun. 9, 2000

(30) Foreign Application Priority Data

Jun. 9, 1999 (JP) .......................................... 11-163107

(51) Int. Cl.⁷ .............................................. H01L 29/12
(52) U.S. Cl. ..................... 428/620; 257/778; 523/435; 523/440; 523/443; 523/444; 523/466; 528/27; 528/33; 528/38; 528/48
(58) Field of Search ................................ 523/440, 443, 523/444, 435, 466; 257/778; 528/27, 33, 38, 43, 403, 405, 406, 419; 428/620; 525/476

(56) References Cited

U.S. PATENT DOCUMENTS

| 4,877,822 A | 10/1989 | Itoh et al. |
| 4,902,732 A | 2/1990 | Itoh et al. |
| 4,999,699 A | 3/1991 | Christie et al. |
| 5,053,445 A | 10/1991 | Itoh et al. |
| 5,089,440 A | 2/1992 | Christie et al. |
| 5,292,688 A | 3/1994 | Hsiao et al. |
| 5,928,595 A | 7/1999 | Knapp et al. |
| 6,180,696 B1 * | 1/2001 | Wong .......................... 523/457 |

FOREIGN PATENT DOCUMENTS

| JP | A6148554 | 3/1986 |
| JP | A6360069 | 3/1988 |

* cited by examiner

Primary Examiner—Robert Dawson
Assistant Examiner—A. Aylward
(74) Attorney, Agent, or Firm—Birch Stewart Kolasch & Birch LLP (57) ABSTRACT

A composition comprising (A) 100 parts of a liquid epoxy resin, (B) 100–300 parts of a spherical inorganic filler having a maximum particle size of up to 50 $\mu$m and a mean particle size of 0.5–10 $\mu$m, (C) 0.1–6 parts of a reactive functional group-containing silicone compound, and (D) 0.01–10 parts of a curing accelerator is suitable as an underfill material for flip-chip type semiconductor devices. The composition has improved thin film infiltration and eliminates voids and other defects.

10 Claims, 1 Drawing Sheet

FLIP-CHIP TYPE SEMICONDUCTOR DEVICE UNDERFILL MATERIAL AND FLIP-CHIP TYPE SEMICONDUCTOR DEVICE

This invention relates to an underfill material for a flip-chip type semiconductor device and a flip-chip type semiconductor device encapsulated therewith.

BACKGROUND OF THE INVENTION

With the advance of electric equipment toward smaller size, lighter weight and higher performance, the semiconductor mounting technology has changed from the pin mating type to the surface mounting which now becomes the mainstream. One bare chip mounting technology is flip-chip (FC) mounting. The flip-chip mounting is a technique of providing an LSI chip on its circuit pattern-bearing surface with several to several thousands of electrodes, known as bumps, of about 10 to 100 microns high and joining the chip to electrodes on a substrate with a conductive paste or solder. Then the sealing material used for the protection of FC devices must penetrate into gaps of several tens of microns defined by bumps between the substrate and the LSI chip. Conventional liquid epoxy resin compositions used as the underfill material for flip-chip devices are generally composed of a liquid epoxy resin, a curing agent and an inorganic filler. Of these, the most predominant is a composition in which a large amount of inorganic filler is blended in order to provide a matching coefficient of linear expansion with those of semiconductor chips, substrates and bumps for increased reliability.

With respect to stress properties, the flip-chip underfill materials with high loading of filler give rise to no problem. However, they suffer from very low productivity since they have a high viscosity due to the high filler loading so that they may penetrate into the gap between chip and substrate at a very slow rate. There is a desire to overcome this problem.

In the conventional epoxy resin compositions for encapsulating semiconductor devices, it is a common practice to treat the fillers, typically silica with surface modifiers such as silane coupling agents for improving the affinity of the silica surface to epoxy resins and hence, the bond strength therebetween. However, the blending of volatile silane coupling agents in underfill materials gives rise to a problem that even a minor amount of volatiles can cause to create voids since the underfill material is heat cured in a very narrow gap.

SUMMARY OF THE INVENTION

An object of the invention is to provide a flip-chip type semiconductor device underfilling material which maintains a low enough viscosity to ensure interstitial infiltration even when filled with a large amount of inorganic filler and which cures into a void-free, reliable product. Another object is to provide a flip-chip type semiconductor device encapsulated with the underfill material and having improved reliability.

It has been found that by blending a liquid epoxy resin with a spherical inorganic filler having a maximum particle size of up to 50 μm and a mean particle size of 0.5 to 10 μm and a reactive functional group-containing silicone compound of the following compositional formula (1) to be defined below instead of a silane coupling agent, there is obtained an underfill material which can infiltrate into narrow gaps even when filled with a large amount of the inorganic filler. This combination minimizes the amount of the alcohol component which would generate when a silane coupling agent is added, and augments the bonds between the surface of inorganic filler and the epoxy resin and between the epoxy resin and the silicon chip. Flip-chip type semiconductor devices encapsulated with the underfill material remain highly reliable because of the absence of voids in the underfill.

Accordingly, the invention provides an underfill material for flip-chip type semiconductor devices, comprising (A) 100 parts by weight of a liquid epoxy resin, (B) 100 to 300 parts by weight of a spherical inorganic filler having a maximum particle size of up to 50 μm and a mean particle size of 0.5 to 10 μm, (C) 0.1 to 6 parts by weight of a reactive functional group-containing silicone compound of the following compositional formula (1):

wherein $R^1$ is a monovalent organic group having a reactive functional group, $R^2$ and $R^3$ are independently unsubstituted or alkoxy-substituted monovalent hydrocarbon groups of 1 to 8 carbon atoms, a is a number of 0.16 to 1.0, b is a number of 0 to 2.0, c is a number of 0.5 to 2.0, a is a number of 0 to 1.0, and a+b+c+d is 0.8 to 3, the number of silicon atoms per molecule being from 2 to 6, and (D) 0.01 to 10 parts by weight of a curing accelerator.

Also contemplated herein is a flip-chip type semiconductor device sealed with the underfill material in a cured state.

BRIEF DESCRIPTION OF THE DRAWINGS

FIG. 2 illustrates a test piece used in an infiltration test, FIG. 2A being a side view and FIG. 2B being a plan view.

DESCRIPTION OF THE PREFERRED EMBODIMENTS

In the liquid epoxy resin composition providing a flip-chip type semiconductor device underfilling material according to the invention, the liquid epoxy resin used as component (A) may be any epoxy resin as long as it has at least two epoxy groups in a molecule. Preferred examples include bisphenol type epoxy resins such as bisphenol A type epoxy resins and bisphenol F type epoxy resins, novolac type epoxy resins such as phenol novolac type epoxy resins and cresol novolac type epoxy resins, naphthalene type epoxy resins, biphenyl type epoxy resins, and cyclopentadiene type epoxy resins. Of these, those epoxy resins which are liquid at room temperature (25° C.) are used. Any of epoxy resins of the following structure may be added to the foregoing epoxy resins in such an amount as not to adversely affect the interstitial infiltration thereof.

The liquid epoxy resins preferably have a total chlorine content of up to 1,500 ppm, and especially up to 1,000 ppm. When chlorine is extracted from the epoxy resin with water at an epoxy resin concentration of 50% and a temperature of 100° C. over a period of 20 hours, the water-extracted chlorine content is preferably up to 10 ppm. At a total chlorine content of greater than 1,500 ppm or a water-extracted chlorine level of more than 10 ppm, the semiconductor device would become less reliable, especially in the presence of moisture.

The inorganic filler (B) used in the inventive composition is in spherical particulate form. Useful spherical inorganic fillers include fused silica, alumina, and aluminum nitride.

In order to improve the infiltration capability, the inorganic filler particles should preferably have a mean particle size of less than about 1/10 and a maximum particle size of less than about ½ of the flip-chip gap width (that is the distance of the substrate-to-chip gap). Specifically, the inorganic filler particles have a maximum particle size of up to 50 μm, desirably up to 25 μm, more desirably up to 10 μm and a mean particle size of at least 0.5 μm, desirably at least 1 μm, and up to 10 μm, desirably up to 5 μm. The mean particle size as used herein can be determined, for example, as the weight average (median diameter) in the particle size distribution as measured by the laser light diffraction method.

The inorganic filler is blended in an amount of about 100 to 300 parts, desirably about 100 to 250 parts by weight per 100 parts by weight of the liquid epoxy resin. Smaller amounts of the filler would provide an epoxy resin composition with a greater coefficient of expansion so that cracks may be incurred in a thermal cycling test. An epoxy resin composition with excessive amounts of the filler would be too viscous, restraining its infiltration in thin film form.

According to the invention, (C) a reactive functional group-containing silicone compound (ie. organosiloxane oligomer) of the following compositional formula (1):

$$R^1{}_a R^2{}_b Si(OR^3)_c(OH)_d O_{(4-a-b-c-d)/2} \quad (1)$$

is blended, thereby preventing void formation and improving the bonds between the inorganic filler and the epoxy resin and between the substrate and the epoxy resin.

For improving such bonds, a silane coupling agent that is a reactive functional group-containing alkoxysilane compound is used in the prior art as previously described. The silane coupling agent has relatively many alkoxy groups in a molecule (typically two or three alkoxy groups per silicon atom). When the silane coupling agent reacts with the substrate or epoxy resin, alkoxy groups therein react with moisture evolving from within the substrate or water on the substrate surface or hydroxyl groups to form an alcohol. In the flip-chip mounting of the device on the substrate, the alcohol thus formed gasifies at high temperature, creating voids. This phenomenon becomes more outstanding when the substrate is an organic substrate and the underfill material used is a self-polymerization type epoxy resin. Such inconvenience is eliminated by using reactive functional group-containing silicone compound (that is, a siloxane oligomer having reactive functional groups and alkoxy groups) instead of the silane coupling agent.

In the above formula (1), $R^1$ is a monovalent organic group having a reactive functional group which is identical with or derived from a reactive functional group in a silane coupling agent material used for the reactive functional group-containing silicone compound. Exemplary reactive functional groups are (meth)acrylic, epoxy, amino, phenyl-substituted amino, and mercapto groups. The reactive functional group is attached to a silicon atom via a divalent hydrocarbon group, which may be separated by an ether oxygen atom, NH group or $N(CH_3)$ group, such as an alkylene group of 1 to 8 carbon atoms, especially 2 to 6 carbon atoms, an arylene group of 6 to 10 carbon atoms, especially 6 to 8 carbon atoms, or an alkylene-arylene group which is a combination of the foregoing alkylene group with the foregoing arylene group. Examples of the divalent hydrocarbon group include methylene, ethylene, propylene (trimethylene), isopropylene (methylethylene), butylene (tetramethylene), isobutylene (methylpropylene), tert-butylene(dimethylethylene), hexylene, cyclohexylene, phenylene and a combination thereof, As mentioned above, the divalent hydrocarbon group may be separated by an ether oxygen atom (—O—), —NH—, —N(CH$_3$)— or the like. Examples of such groups are oxyalkylene, iminoalkylene, oxyarylene, iminoarylene, oxyalkylene-arylene, and iminoalkylene-arylene groups. Examples of the monovalent organic group having the reactive functional group $R^1$ include the following groups.

H$_2$NCH$_2$CH$_2$NHCH$_2$CH$_2$CH$_2$—
H$_2$NCH$_2$CH$_2$CH$_2$—
HSCH$_2$CH$_2$CH$_2$—

$R^2$ and $R^3$ are independently unsubstituted or alkoxy-substituted monovalent hydrocarbon groups of 1 to 8 carbon atoms. Examples of the unsubstituted or alkoxy-substituted monovalent hydrocarbon groups include alkyl groups such as methyl, ethyl, propyl, isopropyl, butyl, isobutyl, tert-butyl, hexyl, cyclohexyl, and octyl; alkenyl groups such as vinyl, allyl, propenyl, butenyl, and hexenyl; aryl groups such as phenyl and tolyl; aralkyl groups such as benzyl; and alkoxy-substituted alkyl groups such as methoxyethyl and ethoxyethyl. It is preferred that $R^2$ be alkyl or aryl group and $R^3$ be alkyl or alkoxy-substituted alkyl. Especially, methyl group, ethyl group or phenyl group is preferable for $R^2$ and methyl group or ethyl group is preferable for $R^3$.

Letters a, b, c and d are numbers satisfying a=0.16 to 1.0, preferably 0.2 to 0.8, b=0 to 2.0, preferably 0.3 to 1.8, c=0.5 to 2.0, preferably 0.55 to 1.8, d=0 to 1.0, preferably 0 to 0.85, and a+b+c+d=0.8 to 3, preferably 1.5 to 3. In the silicone compound, the number of silicon atoms per molecule is 2 to 6, preferably 2 to 5, especially 2, 3 or 4.

The silicone compound or siloxane oligomer of formula (1) preferably has an alkoxy group content of up to 35% by weight, more preferably up to 30% by weight, and most preferably up to 21% by weight. Too higher alkoxy contents can generate larger amounts of alcohol, inviting void defects. The lower limit of the alkoxy group content is preferably about 7% by weight, more preferably about 10% by weight. Too lower alkoxy contents would result in an inferior compatibility and adhesion strength between an epoxy resin and an inorganic filler, inviting low humidity resistance and void defects.

The silicone compound (organosiloxane oligomer) can be prepared by adding water to an alkoxysilane having the above-described reactive functional group, that is, silane coupling agent or a mixture of such a silane coupling agent and an alkoxysilane or alkoxysiloxane oligomer free of the reactive functional group in a suitable ratio, effecting partial hydrolysis and condensation in a conventional manner, and removing volatile components as by vacuum distillation. The term "partial hydrolysis" used herein means to effect hydrolysis and condensation such that at least one, preferably at least two alkoxy groups may be left in the siloxane oligomer as the product. In the silicone compound of formula (1) thus obtained, the amount of residual volatile components (which will volatilize at or above 50° C. under atmospheric pressure) is preferably up to 1% by weight, often up to 0.5% by weight, desirably up to 0.2% by weight, and more desirably up to 0.1% by weight. Too much amounts of residual volatile components can cause void generation.

Illustrative examples of the silane coupling agent used herein are given below, though not limited thereto.

Illustrative examples of the alkoxysilane or alkoxysiloxane oligomer other than the coupling agent are given below, though not limited thereto.

Illustrative examples of the silicone compound (organosiloxane oligomer) of formula (1), that is, partial hydrolytic condensate of alkoxysilanes containing reactive functional group-bearing alkoxysilane are given below, though not limited thereto.

Herein, $R^1$ is as defined above.

The amount of the silicone compound or siloxane oligomer (C) blended is 0.1 to 6 parts, preferably 0.2 to 5 parts, and more preferably 0.2 to 3 parts by weight per 100 parts by weight of the epoxy resin (A). Outside the range, too smaller amounts fail to achieve a sufficient bond to the silicon chip or the substrate and between the silica interface and the resin, resulting in a decline of strength under hot humid conditions. Too larger amounts correspond to large amounts of volatile component, causing void generation and poor heat resistance.

Component (D) in the inventive composition is a curing accelerator. Any of well-known curing accelerators may be used. Illustratively, one or more curing accelerators selected from imidazole derivatives, tertiary amine compounds, and organic phosphorus compounds may be blended. Exemplary imidazole derivatives are 2-methylimidazole, 2-ethylimidazole, 4-methylimidazole, 4-ethylimidazole, 2-phenylimidazole, 2-phenyl-4-methylimidazole, 2-phenyl-4-hydroxymethylimidazole, 2-ethyl-4-methylimidazole, 1-cyanoethyl-2-methylimidazole, 2-phenyl-4-methyl-5-hydroxymethylimidazole, and 2-phenyl-4,5-dihydroxymethylimidazole. Exemplary tertiary amine compounds are amine compounds having alkyl or aralkyl groups as the substituent attached to the nitrogen atom such as triethylamine, benzyltrimethylamine, and α-methylbenzyldimethylamine; cycloamidine compounds and salts thereof with organic acids such as 1,8-diazabicyclo-[5.4.0]undecene-7 and the phenol salt, octylic acid salt, and oleic acid salt thereof; salts or complex salts of cycloamidine compounds with quaternary boron compounds such as the compound represented by the following formula.

Exemplary organic phosphorus compounds are triorganophosphine compounds such as triphenylphosphine, and quaternary phosphonium salts such as tetraphenylphosphonium tetraphenyl borate.

An appropriate amount of the curing accelerator blended is 0.01 to 10 parts, desirably 0.5 to 5 parts by weight per 100 parts by weight of the epoxy resin. Less than 0.01 part of the curing accelerator may not be effective for accelerating cure whereas more than 10 parts is effective for accelerating cure, but tends to detract from storage stability.

The above-described epoxy resin can be cured with the curing accelerator (D) alone (i.e., in case of a self-polymerizable epoxy resin). A curing agent is used as the case may be. Typical curing agents include acid anhydrides of about 4 to 25 carbon atoms, preferably about 8 to 20 carbon atoms, preferably containing one or two aliphatic or aromatic rings and one or two acid anhydride groups in a molecule, such as tetrahydrophthalic anhydride, methyltetrahydrophthalic anhydride, methylhexahydrophthalic anhydride, hexahydrophthalic anhydride, methylhymic anhydride, pyromellitic acid dianhydride, benzophenonetetracarboxylic acid dianhydride, 3,3',4,4'-biphenyltetracarboxylic acid dianhydride, bis(3,4-dicarboxyphenyl)ether dianhydride, bis(3,4-dicarboxyphenyl)methane dianhydride, and 2,2-bis(3,4-dicarboxyphenyl)propane dianhydride; and carboxylic acid hydrazides such as dicyandiamide, adipic acid hydrazide and isophthalic acid hydrazide.

Where an acid anhydride is used as the curing agent, it is preferably blended so as to give 0.3 to 0.7 mol of acid anhydride groups (i.e., group) per mol of epoxy groups in the epoxy resin. Less than 0.3 mol of acid anhydride groups would provide insufficient curability whereas an amount giving more than 0.7 mol of acid anhydride groups would leave part of the acid anhydride unreacted, which leads to a drop of glass transition temperature. The more desirable range is 0.4 to 0.6 mol. In the underfill material of the invention, silicone rubber, silicone oil, liquid polybutadiene rubber or a thermoplastic resin such as methyl methacrylate-butadienestyrene copolymer may be blended for the purpose of stress reduction. The preferred stress reducing agent is a copolymer obtained through addition reaction between an epoxy or phenolic resin having alkenyl groups and an organohydrogenpolysiloxane represented by the following average compositional formula (3) and having 10 to 400 silicon atoms, preferably 40 to 200 silicon atoms, and 1 to 5 SiH groups (i.e., hydrogen atoms attached to silicon atoms), preferably 2 to 4 SiH groups per molecule. The addition reaction takes place between alkenyl groups on the epoxy or phenolic resin and SiH groups on the organopolysiloxane.

$$H_a R_b SiO_{(4-a-b)/2} \tag{3}$$

Herein R is a substituted or unsubstituted monovalent hydrocarbon group, a is a positive number of 0.005 to 0.2, b is a positive number of 1.8 to 2.2, and $1.805 \leq a+b \leq 2.3$, preferably a is 0.01 to 0.1, b is 1.9 to 2.0, and $1.91 \leq a+b \leq 2.1$.

The monovalent hydrocarbon groups represented by R are preferably those of 1 to 10 carbon atoms, especially 1 to 8 carbon atoms, and preferably free of aliphatic unsaturation, for example, alkyl groups such as methyl, ethyl, propyl, isopropyl, butyl, isobutyl, tert-butyl, hexyl, cyclohexyl, octyl, and decyl; alkenyl groups such as vinyl, allyl, propenyl, butenyl, and hexenyl; aryl groups such as phenyl, xylyl and tolyl; and aralkyl groups such as benzyl, phenylethyl and phenylpropyl. Also included are halogen-substituted monovalent hydrocarbon groups wherein some or all of the hydrogen atoms in the foregoing hydrocarbon groups are replaced by halogen atoms such as chlorine, fluorine and bromine, for example, chloromethyl, bromoethyl and trifluoropropyl.

Preferred examples of the alkenyl group-containing phenolic or epoxy resin used in the copolymer are shown by the following formulae.

-continued

Herein, p and q are numbers satisfying $1 \leq p \leq 20$ and $1 \leq q \leq 5$, more preferably $1 \leq p \leq 10$ and $1 \leq q \leq 3$.

Examples of the organohydrogenpolysiloxane used in the copolymer include both end trimethylsiloxy-blocked methylhydrogenpolysiloxane, both end trimethylsiloxy-blocked dimethylsiloxane-methylhydrogensiloxane copolymers, both end dimethylhydrogensiloxy-blocked dimethylpolysiloxane, both end dimethylhydrogensiloxy-blocked dimethylsiloxane-methylhydrogensiloxane copolymers, both end dimethylhydrogensiloxy-blocked dimethylsiloxane-diphenylsiloxane copolymers, both end dimethylhydrogensiloxy-blocked dimethylsiloxane-methylphenylsiloxane copolymers. Although these exemplary siloxanes are of basically straight-chain structure, they may partially contain a branched siloxane structure.

The organopolysiloxane desirably has a molecular weight of about 700 to 50,000 though not critical. When a copolymer obtained from an organopolysiloxane having a molecular weight of about 700 to 50,000 is blended in the epoxy resin composition, the copolymer is incompatible with the matrix and forms a fine island-in-sea structure. With a molecular weight of less than 700, the copolymer is compatible with the matrix so that the island-in-sea structure may disappear. With a molecular weight of more than 50,000, the island-in-sea structure becomes larger. In either case, the advantage of stress reduction can be degraded.

In preparing a copolymer by reacting the alkenyl group-containing epoxy or phenolic resin with the organohydrogenpolysiloxane, well-known addition reaction can be employed to effect hydrosilylation reaction between alkenyl groups in the epoxy resin and hydrogen atoms attached to silicon atoms (i.e., SiH groups) in the organohydrogenpolysiloxane.

As the block copolymer mentioned above, use may be made of the known copolymers disclosed in JP-B 61-48544 corresponding to U.S. Pat. No. 4,902,732 and JP-B 63-60069 corresponding to U.S. Pat. No. 4,877,822 and U.S. Pat. No. 5,053,445. Typical examples are given below.

Herein, R is as defined above, $R^1$ is hydrogen or alkyl of 1 to 4 carbon atoms, $R^2$ is —CH$_2$CH$_2$CH$_2$—, —OCH$_2$—CH(OH)—CH$_2$—O—CH$_2$CH$_2$CH$_2$— or —O—CH$_2$CH$_2$CH$_2$—, $R^3$ is hydrogen, methyl or trifluoromethyl, letter n is an integer of 4 to 199, preferably 19 to 99, p is an integer of 1 to 10, and q is an integer of 1 to 10.

The copolymer is blended in such amounts that 0 to 20 parts, and preferably 2 to 15 parts by weight of the diorganopolysiloxane units may be available per 100 parts by weight of the epoxy resin (A) whereby the stress can be further reduced.

In the underfill material in the form of a liquid epoxy resin composition according to the invention, various other additives are blended if necessary. Such additives include carbon-functional silanes for improving tackiness, pigments (e.g., carbon black), dyestuffs, antioxidants, and surface treating agents (e.g., γ-glycidoxypropyltrimethoxysilane).

Also, if necessary, other well-known curing agents and curing accelerators may be blended as long as the objects of the invention are not impaired. It is recommended to avoid the use of acid anhydride curing agents.

The epoxy resin composition according to the invention can be prepared, for example, by simultaneously or separately agitating, dissolving, mixing and dispersing the epoxy resin, inorganic filler, silicone compound, curing accelerator, and other optional ingredients while heating if desired. The device for mixing, agitating and dispersing the ingredients is not critical although an attritor, three-roll mill, ball mill or planetary mixer each equipped with agitating and heating means is generally used. A suitable combination of these devices is also useful.

The underfill material should preferably have a viscosity of less than about 10,000 poises at 25° C. Also the underfill material should preferably have a coefficient of thermal expansion of 20 to 40 ppm/° C. at temperatures below the glass transition temperature of its cured product.

Figure 1:
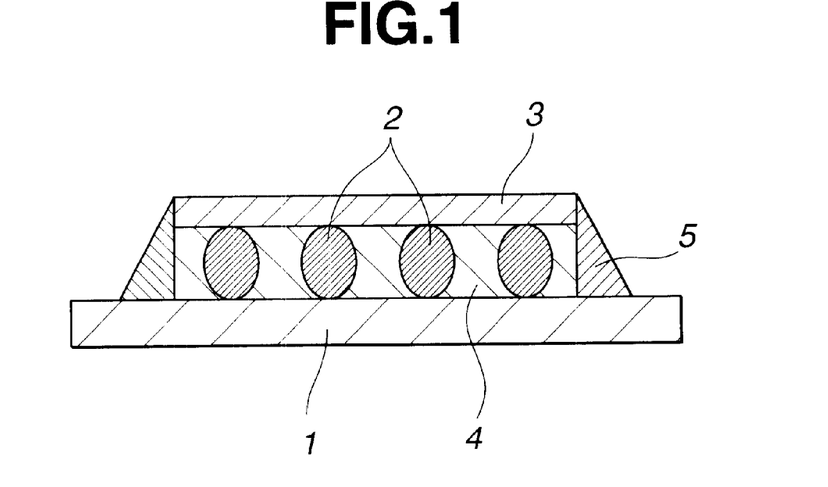
FIG. 1 is a schematic cross-sectional view of a flip-chip type semiconductor device according to one embodiment of the invention.

Referring to FIG. 1, a flip-chip type semiconductor device to which the underfill material of the invention is applicable is illustrated as comprising an organic substrate 1 having a wiring pattern-bearing surface (upper surface in the figure). A semiconductor chip 3 is mounted on the wiring pattern-bearing surface via a plurality of bumps 2 to define gaps between the substrate 1 and the semiconductor chip 3 and also between the bumps 2. The gaps are filled with an underfill material 4 and sealed along sides thereof with a fillet material 5.

A conventional method and conditions may be employed in molding or forming the underfill material. Preferably, a seal is formed by molding and curing the underfill material in a heating oven at 120° C. for at least ½ hour and post-curing at 150° C. for at least ½ hour.

Any of well-known sealing materials may be used as the fillet material although a liquid epoxy resin composition similar to the above-mentioned one may also be used. The liquid epoxy resin composition for the fillet should preferably have a coefficient of thermal expansion of 10 to 20 ppm/° C. at temperatures below the glass transition temperature of its cured product.

EXAMPLE

Examples of the invention are given below by way of illustration and not by way of limitation.

Examples 1–6 and Comparative Examples 1–3

Nine epoxy resin compositions were prepared by uniformly milling the components shown in Table 1 in a three-roll mill. The following tests were carried out on these epoxy resin compositions. The results are also shown in Table 1.

Viscosity

Using a BH type rotating viscometer, a viscosity at 25° C. was measured at 20 rpm.

Thixotropy

Using a BH type rotating viscometer, a viscosity at 25° C. was measured at 2 rpm and 20 rpm. Thixotropy is the viscosity at 2 rpm divided by the viscosity at 20 rpm.

Gelling Time

The time passed until the composition gelled on a hot plate at 150° C. was measured.

Glass Transition Temperature (Tg)

Using a thermomechanical analyzer (TMA), glass transition was observed while heating a cured sample of 5 mm×5 mm×15 mm at a rate of 5° C./min.

CTE-1: a coefficient of thermal expansion at temperatures below Tg.

CTE-2: a coefficient of thermal expansion at temperatures above Tg.

In the above measurement of Tg, CTE-1 was determined in the temperature range of 50 to 80° C. and CTE-2 was determined in the temperature range of 200 to 230° C.

Infiltration Test

Figure 2A:
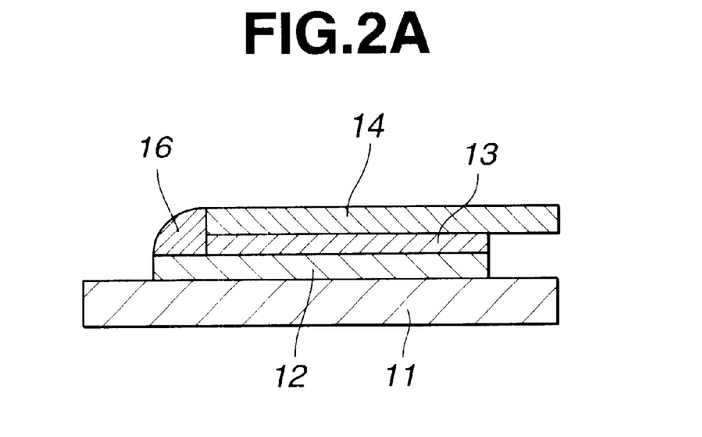
Figure 2B:
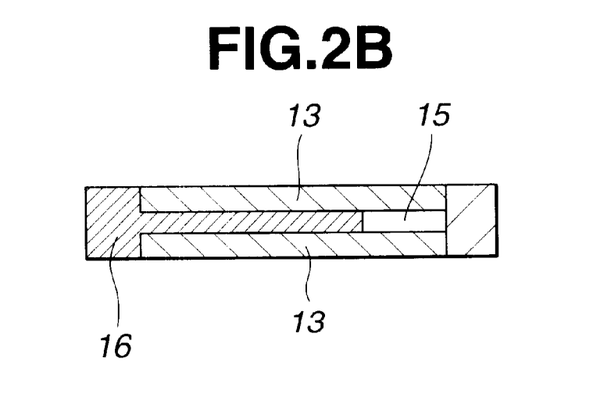

As shown in FIGS. 2A and 2B, a lower slide glass plate 12 was rested on a hot plate 11. A pair of 80-micron polyimide films 13 and 13 laterally spaced 1 cm from each other were set on the glass plate 12. An upper slide glass plate 14 was rested thereon. The slide glass plates 12, 14 defined with the two polyimide films 13, 13 an elongated space 15 having a width of 1 cm and a height of 80 μm. A mass of epoxy resin composition 16 was placed on the lower slide glass plate 12 at one end of the space 15. With this setting, the hot plate 11 was heated at 80° C. or 120° C. whereupon the epoxy resin composition 16 infiltrated through the space 15. The infiltration time was measured until the composition 16 infiltrated and reached a distance of 20 mm from the one end of the space 15.

PCT Separation Test

A polyimide-coated silicon chip of 10 mm×10 mm was rested on a FR-4 substrate of 30 mm×30 mm with a spacer of about 100 μm thick interposed therebetween. An epoxy resin composition for the underfill was forced to penetrate into the gap between the chip and the substrate and cured therein. The assembly was placed for 168 hours in a pressure cooker test (PCT) environment of 121° C. and 2.1 atm. Thereafter, whether the underfill separated from the chip and the substrate was observed by C-SAM.

Void Detection by Ultrasonic Flaw Detector

A silicon chip of 10 mm×10 mm having 400 bumps was rested on a BT substrate. The assembly was held for 2 hours in an atmosphere of 23° C. and RH 60%. Using a dispenser, an epoxy resin composition was applied to one side of the assembly to seal the underfill area therewith. After the underfill was heat cured, internal voids were detected by means of an ultrasonic flaw detector. A percent void is calculated as the total area of voids divided by the sealing area of the cured underfill.

TABLE 1

| Components (pbw) | Example 1 | Example 2 | Example 3 | Example 4 | Example 5 | Example 6 | Comparative Example 1 | Comparative Example 2 | Comparative Example 3 |
|---|---|---|---|---|---|---|---|---|---|
| RE310 | 100 | | 50 | 100 | 100 | 100 | 100 | 50 | 100 |
| RE304 | | 100 | | | | | | | |
| MH700 | | | 40 | | | | | 40 | |
| Silica | 150 | 150 | 200 | 150 | 150 | 150 | 150 | 200 | 150 |

TABLE 1-continued

| Components (pbw) | Example 1 | Example 2 | Example 3 | Example 4 | Example 5 | Example 6 | Comparative Example 1 | Comparative Example 2 | Comparative Example 3 |
|---|---|---|---|---|---|---|---|---|---|
| Silicone compound A | 3.0 | | | | | | | | 8.0 |
| Silicone compound B | | 1.0 | | | | | | | |
| Silicone compound C | | | 1.0 | | | | | 8.0 | |
| Silicone compound D | | | | 2.0 | | | | | |
| Silicone compound E | | | | | 1.0 | | | | |
| Silicone compound F | | | | | | 1.0 | | | |
| 2P4MHZ | 4 | 4 | | 5 | 4 | 4 | 4 | | 4 |
| HX3741 | | | 3 | | | | | 3 | |
| Viscosity (poise/25° C.) | 350 | 380 | 85 | 380 | 360 | 360 | 400 | 50 | 280 |
| Thixotropy | 1.01 | 1.02 | 1.02 | 1.03 | 1.02 | 1.02 | 1.04 | 1.01 | 1.01 |
| Gelling time (sec/150° C.) | 80 | 80 | 85 | 72 | 78 | 78 | 78 | 95 | 80 |
| Tg (° C.) | 142 | 132 | 150 | 140 | 130 | 130 | 143 | 138 | 135 |
| CTE-1 (ppm/° C.) | 30 | 31 | 26 | 30 | 30 | 30 | 31 | 28 | 32 |
| CTE-2 (ppm/° C.) | 105 | 103 | 97 | 103 | 105 | 105 | 110 | 105 | 110 |
| Infiltration time (sec/80° C.) | 280 | 250 | 110 | 290 | 240 | 280 | 300 | 85 | 210 |
| Infiltration time (sec/120° C.) | 75 | 76 | — | 70 | 75 | 79 | 86 | — | 65 |
| PCT separation test | Not separated | Not separated | Not separated | Not separated | Not separated | Not separated | Separated | Not separated | Not separated |
| Voids (%) | 0 | 0 | 0 | 0 | 0 | 0 | 0 | 12 | 10 |

Note:
(1) RE310: bisphenol A type epoxy resin by Nippon Kayaku K.K.
(2) RE304: bisphenol F type epoxy resin by Nippon Kayaku K.K.
(3) MH700: methyltetrahydrophthalic anhydride by Shin-Nippon Rika K.K.
(4) Silica: true spherical silica having a mean particle size of 8 μm, a maximum particle size of 24 μm and a specific surface area of 2 m²/g
(5) Silicone compound: shown below
(6) 2P4MHZ: 2-phenyl-4-methyl-5-hydroxymethyl by Shikoku Chemicals K.K.
(7) HX3741: microcapsulated catalyst containing an imidazole compound by Asahi-Ciba K.K.

Silicone Compounds

Silicone Compound A
  alkoxy content: 13.9 wt %
  volatile content: 0.09 wt %

Silicone Compound B
  alkoxy content: 14.9 wt %
  volatile content: 0.08 wt %

Silicone compound C
  alkoxy content: 20.9 wt %
  volatile content: 0.06 wt %

Silicone compound D
  alkoxy content: 20.5 wt %
  volatile content: 0.15 wt %

Silicone compound E
  alkoxy content: 32.1 wt %
  volatile content: 0.20 wt %

Silicone compound F
  alkoxy content: 29.5 wt %
  volatile content: 0.50 wt %

Quantitative Determination of Alkoxy Groups
  The amount of alkoxy groups in the silicone compound was quantitatively determined by the acetylation method (see A. Lee Smith, Analysis of Silicone, pp. 154–155, John Wiley & Sons, New York, 1974).

Measurement of Volatile Content

The volatile content in the silicone compound was measured by placing 2 g of the silicone compound in an aluminum dish and allowing it to stand for one hour at 105° C.

There has been described a flip-chip type semiconductor device underfilling material having an improved thin-film infiltration capability and free of voids or defects. The flip-chip type semiconductor device sealed therewith remains highly reliable.

Japanese Patent Application No. 11-163107 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. An underfill material for flip-chip type semiconductor devices, comprising
    (A) 100 parts by weight of a liquid epoxy resin,
    (B) 100 to 300 parts by weight of a spherical inorganic filler having a maximum particle size of up to 50 μm and a mean particle size of 0.5 to 10 μm,
    (C) 0.1 to 6 parts by weight of a reactive functional group-containing silicone compound of the following compositional formula (1):

$$R^1_a R^2_b Si(OR^3)_c(OH)_d O_{(4-a-b-c-d)/2} \qquad (1)$$

wherein $R^1$ is a monovalent organic group having a reactive functional group, $R^2$ and $R^3$ are independently unsubstituted or alkoxy-substituted monovalent hydrocarbon groups of 1 to 8 carbon atoms, a is a number of 0.16 to 1.0, b is a number of 0 to 2.0, c is a number of 0.5 to 2.0, d is a number of 0 to 1.0, and a+b+c+d is 0.8 to 3, the number of silicon atoms per molecule being from 2 to 6, and
    (D) 0.01 to 10 parts by weight of a curing accelerator.

2. A flip-chip type semiconductor device sealed with the underfill material of claim 1 in a cured state.

3. The underfill material for flip-type semiconductor devices according to claim 1, wherein the liquid epoxy resin is a member selected from the group of bisphenol A type epoxy resins, bisphenol F type epoxy resins, phenol novolac type epoxy resins, cresol novolac type epoxy resins, naphthalene type epoxy resins, biphenyl type epoxy resins, and cyclopentadiene type epoxy resins.

4. The underfill material for flip-type semiconductor devices according to claim 3, wherein the epoxy resins are used at room temperature (25°C).

5. The underfill material for flip-type semiconductor devices according to claim 1, which further comprises either of compounds (I) or (II):

6. The underfill material for flip-type semiconductor devices according to claim 1, wherein the spherical inorganic fillers are selected from the group consisting of fused silica, alumina, and aluminum nitride.

7. The underfill material for flip-type semiconductor devices according to claim 1, wherein the mean particle size is determined by a laser light diffraction method.

8. The underfill material for flip-type semiconductor devices according to claim 1, wherein the inorganic filler is blended in an amount of about 100 to 250 parts by weight per 100 parts by weight of the liquid epoxy resin.

9. The underfill material for flip-type semiconductor devices according to claim 1, wherein $R^1$ is selected from the group consisting of (meth)acrylic, epoxy, amino, phenyl-substituted amino, and mercapto groups.

10. The underfill material for flip-type semiconductor devices according to claim 1, wherein R2 and R3 are the same or different and are selected from the group consisting of methyl, ethyl propyl, isopropyl, butyl, isobutyl, t-butyl, hexyl, cyclohexyl, and octyl.

* * * * *